United States Patent [19]

Muramatsu et al.

[11] Patent Number: 5,389,191
[45] Date of Patent: Feb. 14, 1995

[54] MOUNTING APPARATUS FOR DEPLOYING AN ELECTRONIC COMPONENT MOUNTS FORMED ON A TAPE CARRIER

[75] Inventors: Eiji Muramatsu; Masaru Kamimura, both of Suwa, Japan

[73] Assignee: Seiko Epson Corporation, Tokyo, Japan

[21] Appl. No.: 136,478

[22] Filed: Oct. 13, 1993

Related U.S. Application Data

[60] Continuation of Ser. No. 818,673, Jan. 9, 1992, abandoned, which is a division of Ser. No. 573,885, Aug. 28, 1990, Pat. No. 5,177,596.

[30] Foreign Application Priority Data

Aug. 28, 1989 [JP] Japan .................. 1-221228

[51] Int. Cl.$^6$ ............................................. B32B 31/00
[52] U.S. Cl. ..................... 156/510; 156/552; 156/644; 156/664; 156/901; 29/825; 29/840; 29/842; 228/178
[58] Field of Search ............... 156/510, 519, 521, 552, 156/556, 644, 655, 656, 901, 664; 174/250; 361/398, 403, 404, 421; 428/901; 29/591, 827, 589, 846, 577, 625, 840, 842, 857; 357/70, 71; 83/874, 167, 409, 414; 228/178

[56] References Cited

U.S. PATENT DOCUMENTS

| | | | |
|---|---|---|---|
| 2,556,787 | 6/1951 | Bach et al. | 156/552 |
| 2,596,068 | 5/1952 | Burch et al. | 156/552 |
| 3,118,804 | 1/1964 | Tibbals | 156/552 |
| 3,376,185 | 4/1968 | Shook et al. | 156/552 |
| 3,440,027 | 4/1969 | Hugle | 29/193.5 |
| 3,689,991 | 9/1972 | Aind | 29/577 |
| 3,772,108 | 11/1973 | Lezben et al. | 156/519 |
| 3,968,563 | 7/1976 | Hamlin | 29/591 |
| 4,063,993 | 12/1977 | Burns | 156/659 |
| 4,222,516 | 9/1980 | Badet et al. | 235/492 |
| 4,251,852 | 2/1981 | Ecker et al. | 361/386 |
| 4,282,056 | 8/1981 | Okui | 156/519 |
| 4,284,454 | 8/1981 | Joa | 156/552 |
| 4,377,316 | 3/1983 | Ecker et al. | 339/17 |
| 4,413,308 | 11/1983 | Brown | 361/398 |
| 4,549,200 | 10/1985 | Ecker et al. | 357/80 |
| 4,664,736 | 4/1987 | Faasse, Jr. | 156/552 |
| 4,681,654 | 7/1987 | Clementi | 156/630 |

FOREIGN PATENT DOCUMENTS

| | | |
|---|---|---|
| 59092 | 9/1982 | European Pat. Off. . |
| 324244 | 7/1989 | European Pat. Off. . |
| 2137805 | 10/1984 | United Kingdom . |
| 2164794 | 3/1986 | United Kingdom . |
| 6348 | 8/1988 | WIPO . |

*Primary Examiner*—Patrick J. Ryan
*Assistant Examiner*—Merrick Dixon
*Attorney, Agent, or Firm*—W. Douglas Carothers, Jr.

[57] ABSTRACT

A mounting apparatus for deploying a plurality of FPC tape carrier electronic component mounting structures having a plurality of cut out regions in a FPC tape carrier formed spatially along the length thereof, which regions define electronic component mounts. These cut out regions are contained within the confines of the FPC tape carrier and having a preformed substantially closed loop cut out boundary. Each of these cut out regions may contain at least one electronic component mount having a semiconductor integrated circuit chip electronic device electrically connected to at least one lead pattern formed on the carrier within the cut out region boundary. Slits or slit apertures are formed at one or more points along the cut out boundary. Securing attachment is provided at one or more points along the mount boundary, which are provided at the regions of the slits or slit apertures to secure the electronic component mounts with minimal connection to the body of the tape carrier. Thereafter, the securing attachment may be easily severed in assembly line fashion with the mounts separated from the tape carrier and transferred via a transfer apparatus to a position for their assembly relative to electronic apparatus undergoing assembly. The securing attachment may be comprised of an adhesive flexible tape (FT) along the length of the tape carrier or may be one or more micro connectors formed from the carrier tape material and extending between the cut out regions forming the mounts and the body of the tape carrier.

6 Claims, 8 Drawing Sheets

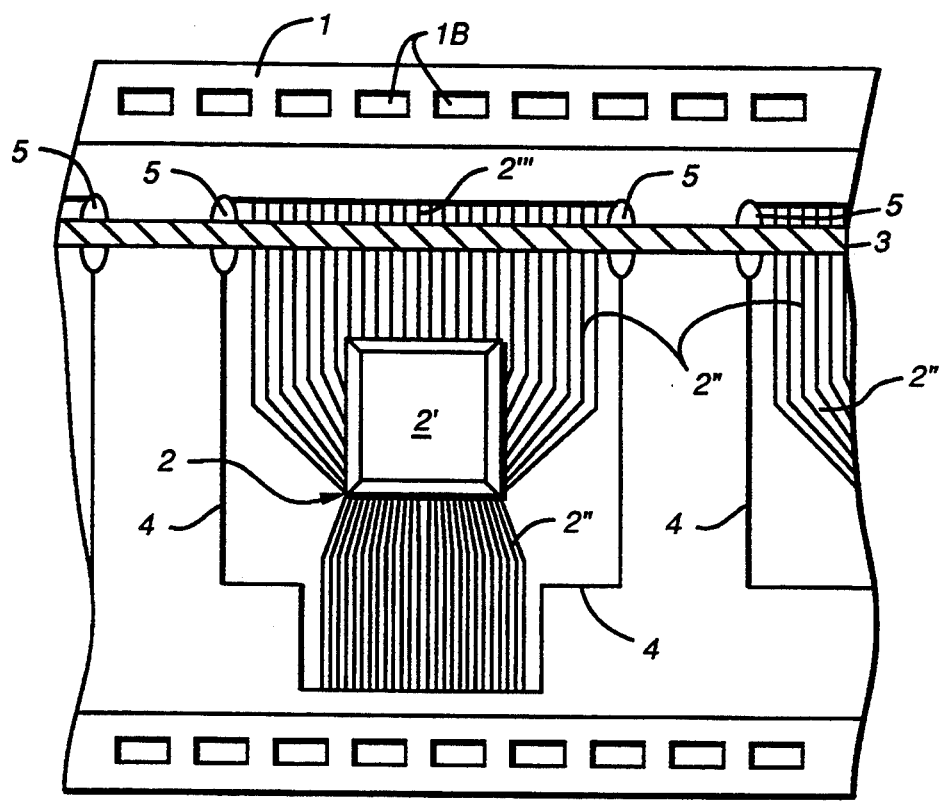
FIG._1
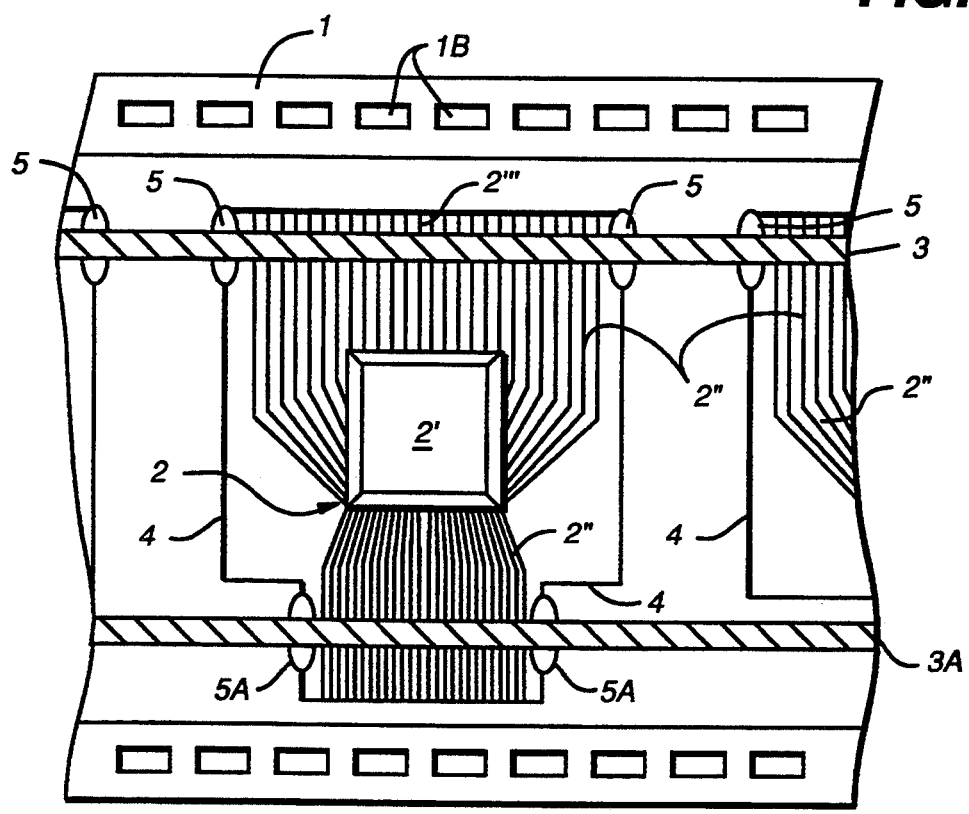
FIG. 2

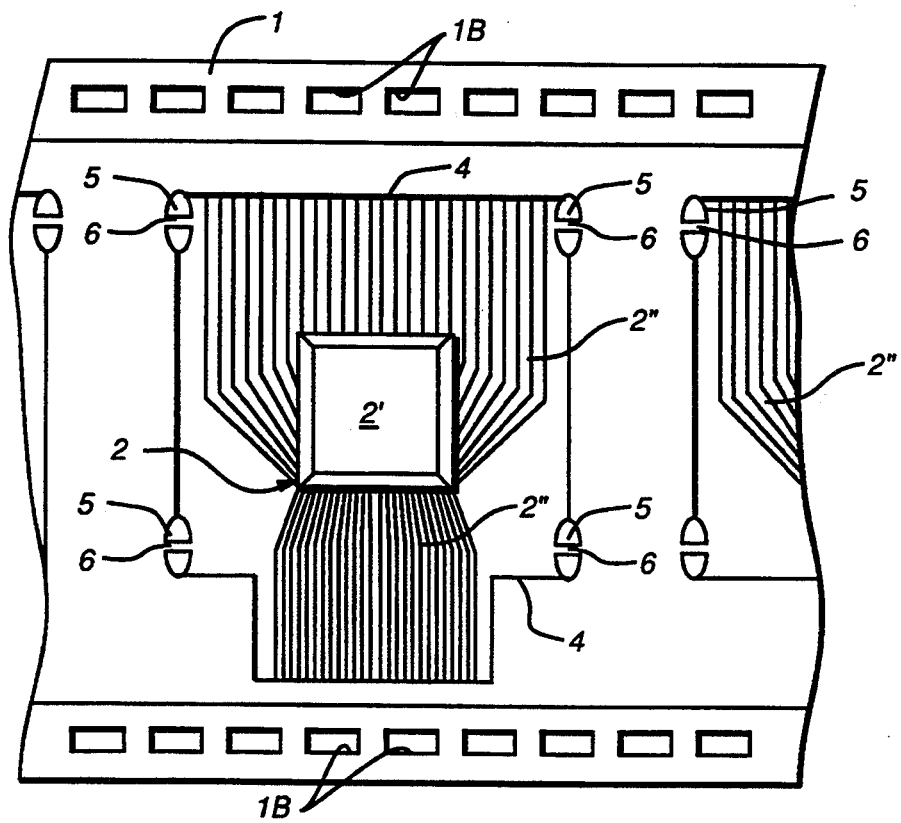
FIG._3
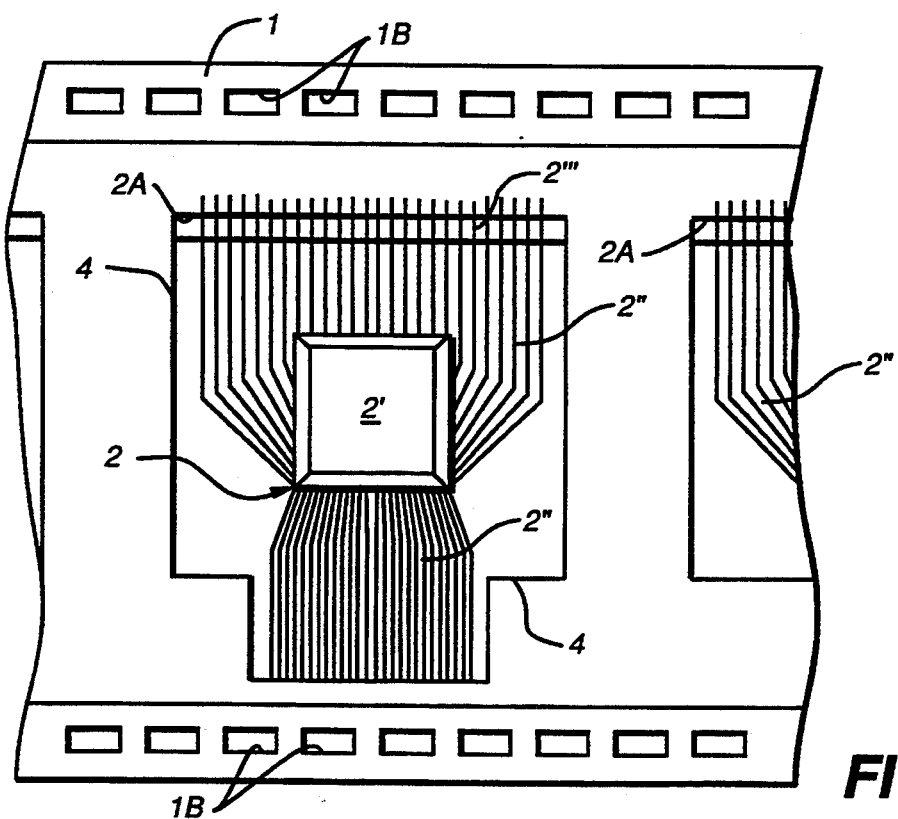
FIG._13
(PRIOR ART)

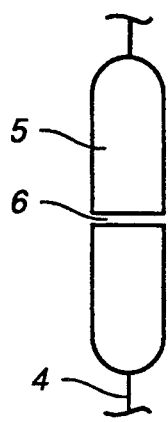
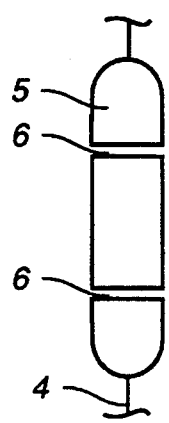
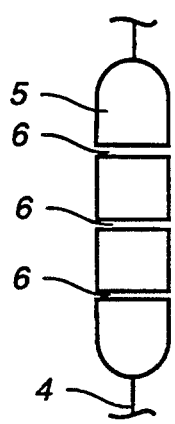
FIG._4A    FIG._4B    FIG._4C
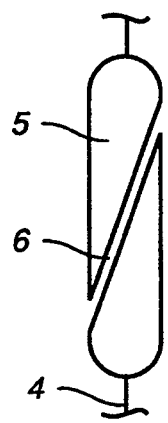
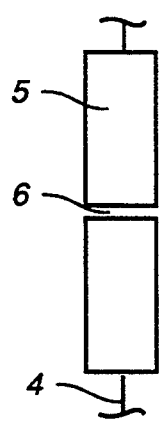
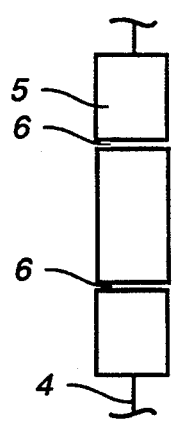
FIG._4D    FIG._4E    FIG._4F
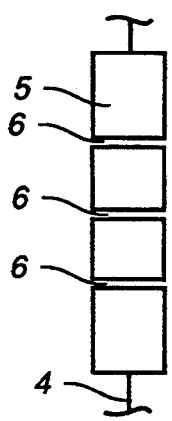
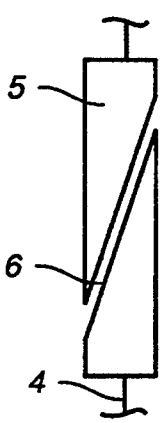
FIG._4G    FIG._4H

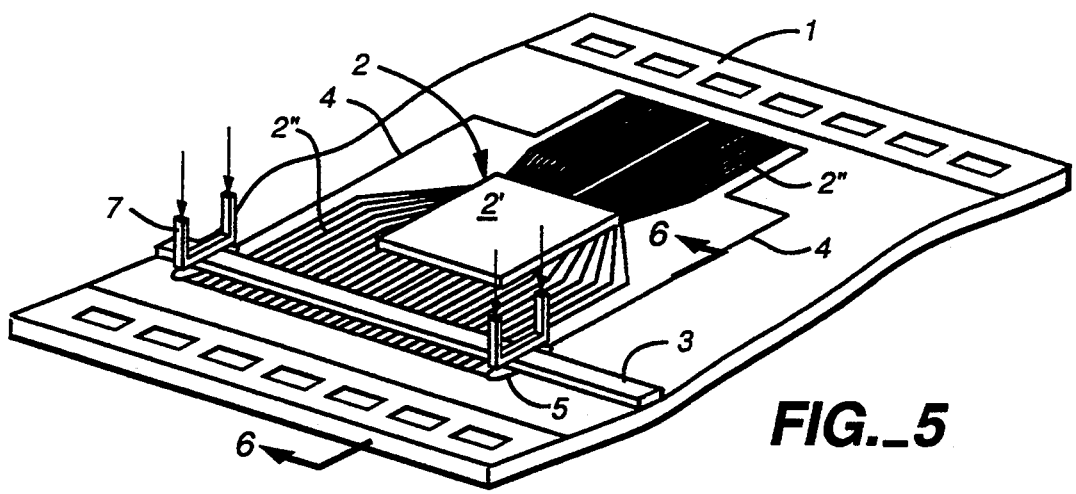
FIG._5
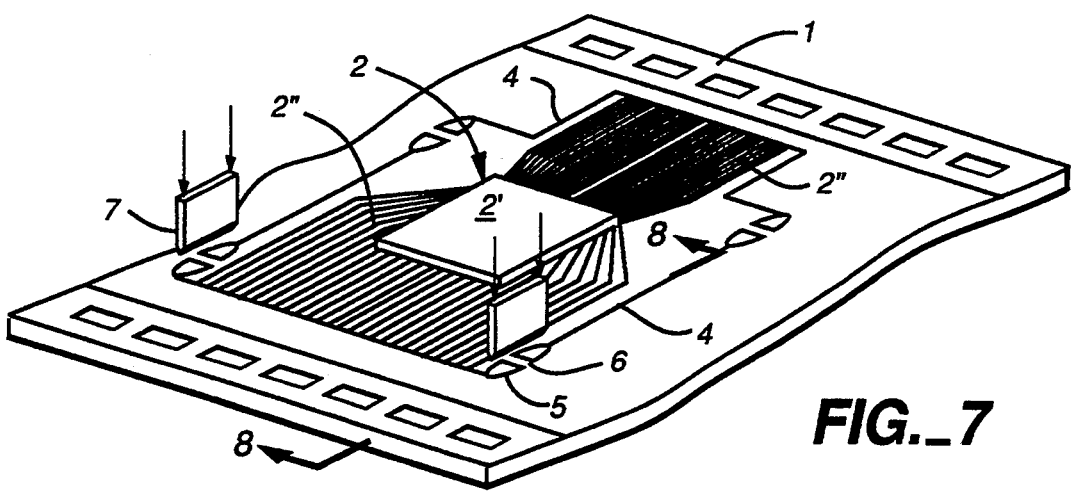
FIG._7
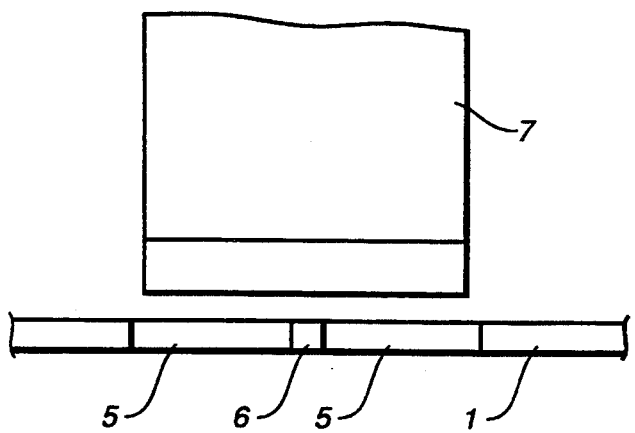
FIG._8A
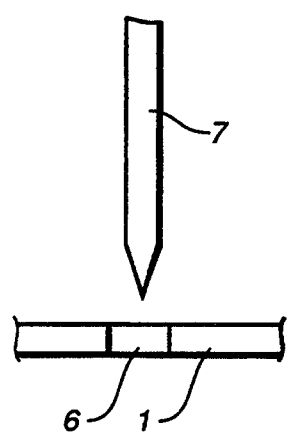
FIG._8B

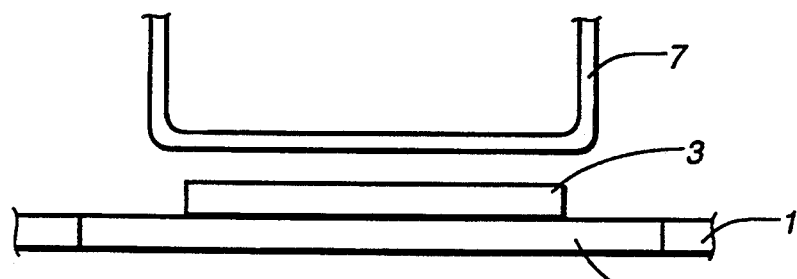
FIG._6A
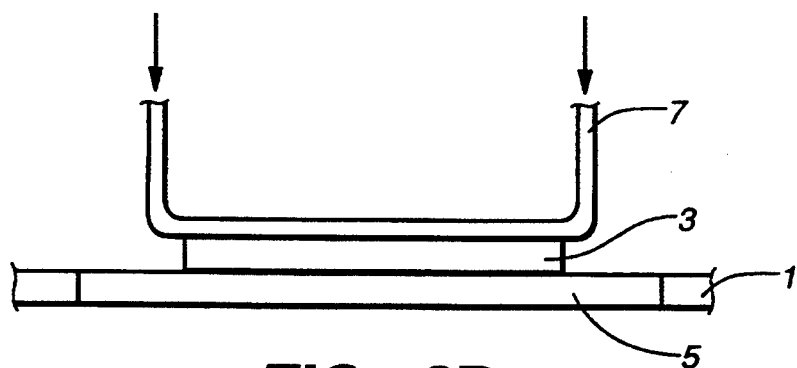
FIG._6B
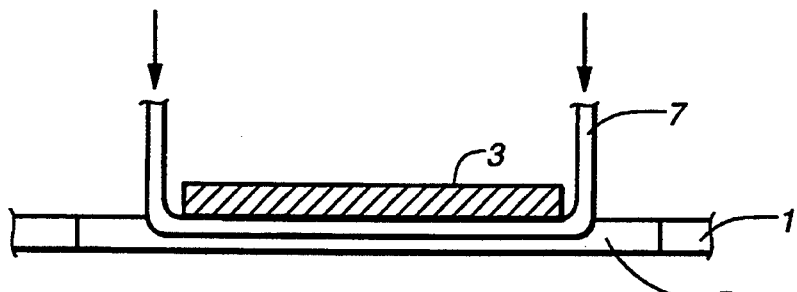
FIG._6C
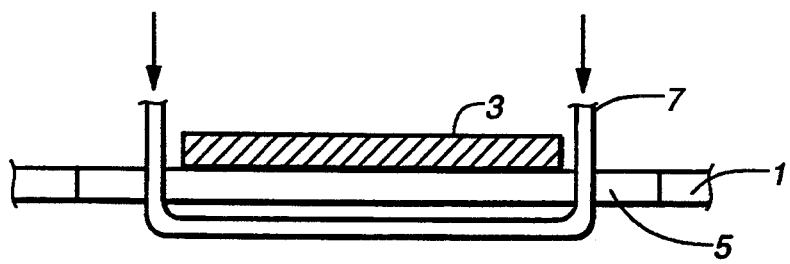
FIG._6D

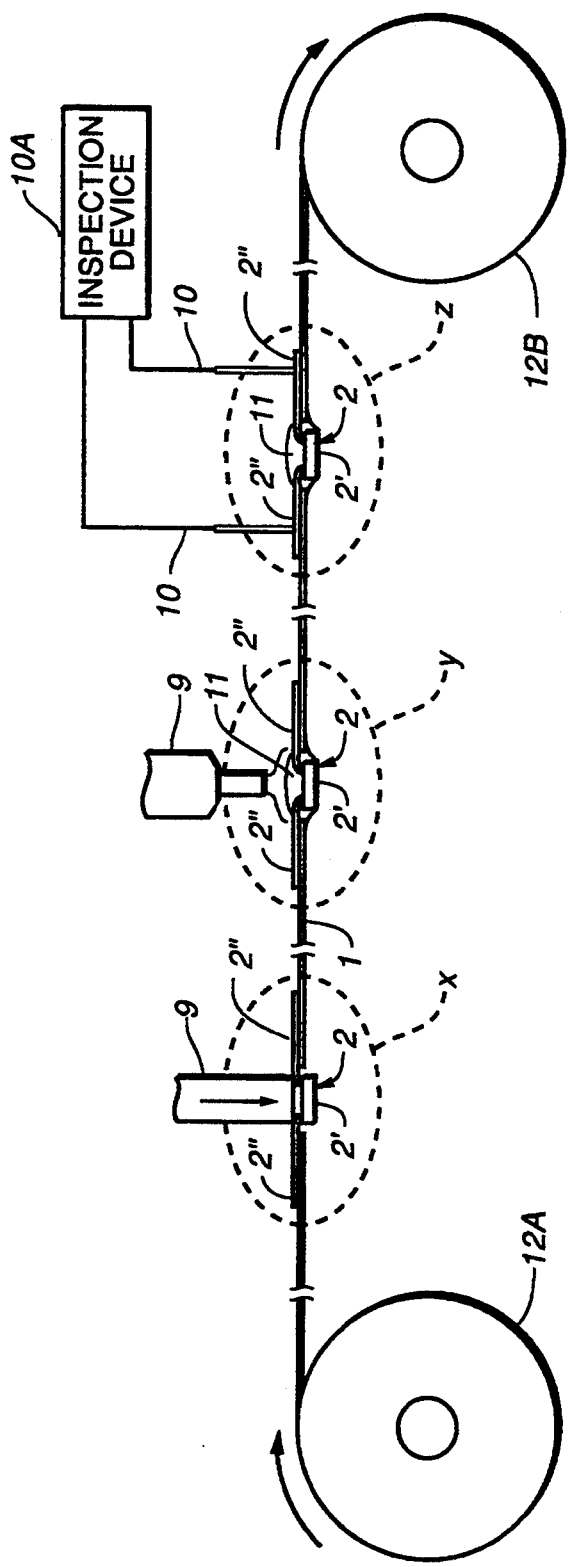
FIG._9

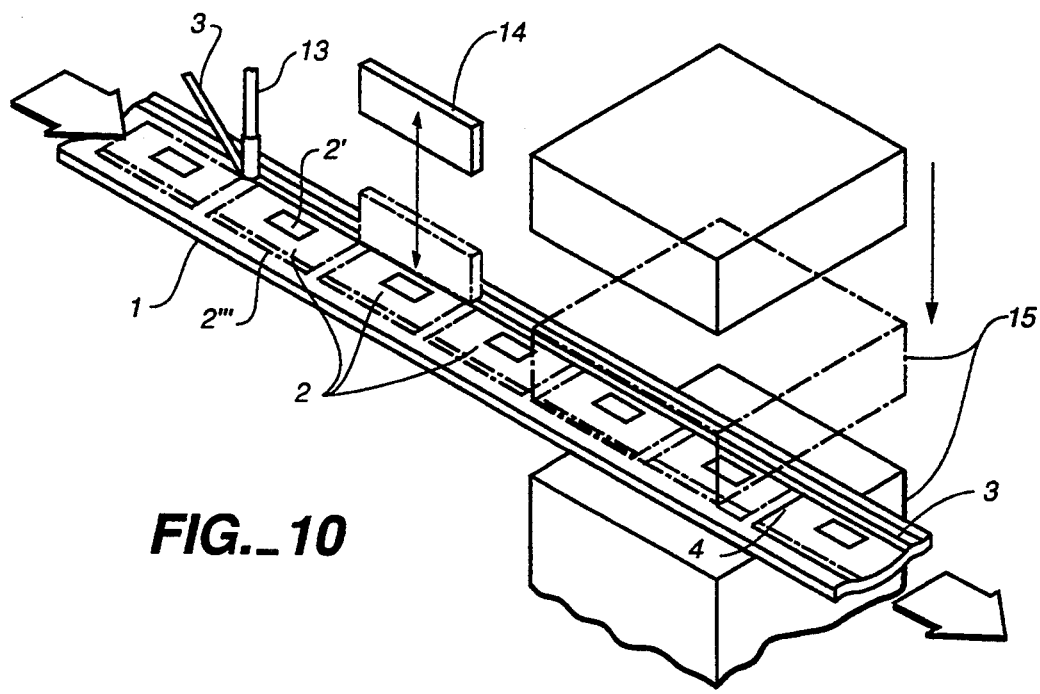
FIG._10
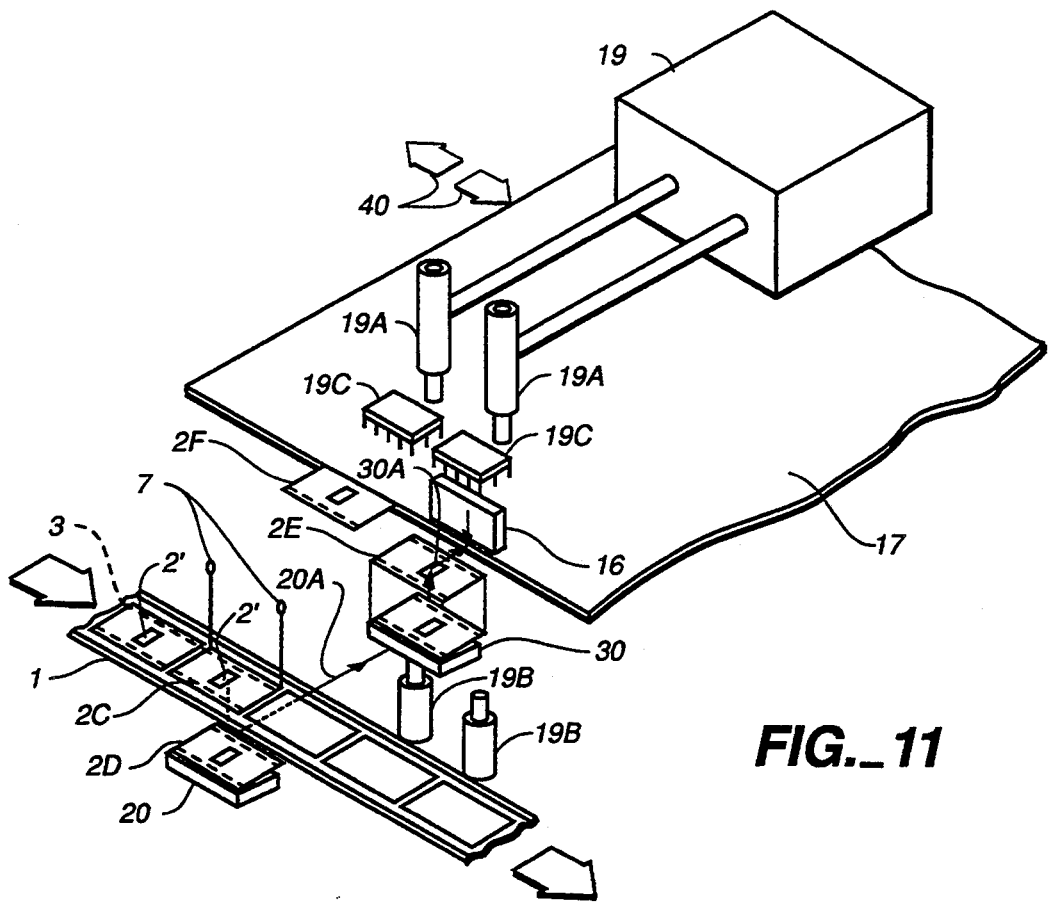
FIG._11

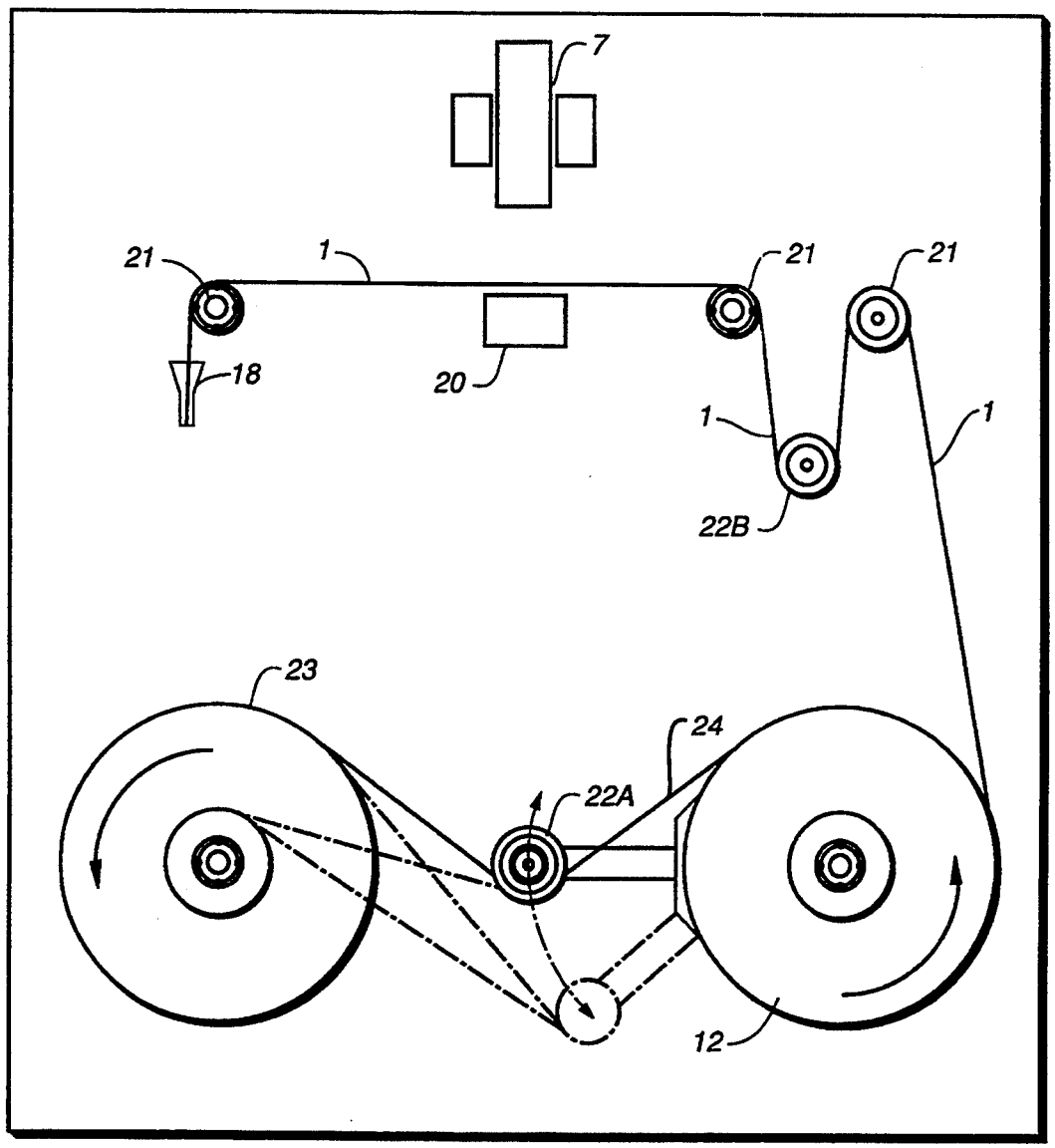
FIG._12

MOUNTING APPARATUS FOR DEPLOYING AN ELECTRONIC COMPONENT MOUNTS FORMED ON A TAPE CARRIER

This is a continuation of application Ser. No. 07/818,673 filed Jan. 9, 1992, now abandoned, which is a division, of application Ser. No. 07/573,885, filed on August 28, 1990, now U.S. Pat. No. 5,177,596.

BACKGROUND OF THE INVENTION

This invention relates generally to mounting apparatus employed in the mounting and subsequent separation of electronic component mounts from a tape carrier for deployment in the manufacture and assembly of electronic apparatus, such as, circuit boards.

It is the practice in the manufacture and assembly of electronic apparatus, such as circuit boards or circuit display panels, to feed a series of electronic component mounts to a mounting apparatus for the purpose of mounting or otherwise mechanically and/or electrically securing the electronic component mounts to the apparatus. These electronic component mounts are formed spatially along the length of a tape carrier and are generally wound on a reel after electronic components, such as semiconductor integrated circuit chips, have been mounted relative to printed circuit lead patterns provided on the tape carrier. Then, the reel of component mounts is transferred to a mounting apparatus wherein the component mounts are separated from the tape carrier and mounted relative to the electronic apparatus being assembled. More recently, FPC tape carriers have been developed to provide for securing, such as by gang bonding, of integrated circuit chips to preformed printed circuit lead patterns spatially provided along the length of the tape carrier. In some cases, these tapes have now been de facto standardized to the size of 35 mm photographic film.

An example of such a tape carrier is shown in FIG. 13 comprising tape carrier 1 having a series of sprocket holes 1B along each edge of the carrier between which are spatially formed electronic component mounts 2 each comprising an electronic device or semiconductor integrated circuit chip 2' having electrical connections or output pads gang bonded to the inner ends of one or more lead patterns 2", which lead patterns have been previously formed directly onto tape carrier 1. Tape carrier 1 may be made of polyimide film or the like. Sprocket holes 1B as well as holes in carrier 1 at the position of chip 2' are formed by a punch press. After these holes are formed in carrier 1, a thin metal film or leaf, such as a laminate copper leaf, is formed along the surface of the tape over the holes formed for chips 2'. Thereafter, photolithography is performed employing a photoresist to pattern and selectively etch the film to form lead patterns 2".

There may also be an opening 2A provided in the film adjacent to the outer ends of the lead pattern 2" to provide a series of lead portions overhanging opening 2A forming a mounting region 2''' when electronic component mounts 2 are removed or separated from tape carrier film 1 by means of cutting or severing along a cut out boundary 4.

In the past, it has been the practice to separate electronic component mounts 2 from tape carrier 1 prior to their assembly relative to electronic apparatus. Thus, the first step is to remove all electronic components 2 from a single tape carrier 1. Since electronic component mounts 2 are physically separated from tape carrier 1, hereinafter referred to as their out-of-tape state, they are autonomic relative one another and relative to carrier tape 1. In this out-of-tape state, component mounts 2 will, of course, have no predetermined alignment relative to one another as they did in their in-tape state. Therefore, they must be transferred as a plural group, properly aligned and positioned for their final assembly relative to mechanical and electrical connection to electronic apparatus being assembled. Thus, the removal of component mounts 2 from carrier tape 1 prior to assemblage relative to such electronic apparatus renders it difficult to consider and successfully improvise a continuously automated process from the electronic component in-tape state to their out-of-tape state, such as in the case wherein the individual electronic component mounts 2 are assembled into electronic apparatus by means, for example, via an outer lead bonding (OLB) process relative to the outer ends of the leads or mounting regions 2''' of lead patterns 2".

Thus, in prior component and mount assembly technology relating to the OLB process for tape carrier lead patterns 2", individual electronic component mounts 2 were separated from FPC tape 1 in their out-of-tape state rendering it difficult to automate the OLB process. Even if the OLB process was automated to handle mounts 2 previously separated from tape carrier 1, means would have to be provided for the individual handling, orientation, transport and positioning in OLB apparatus for accomplishing pressure adhesion attachment and lead connection into electronic apparatus undergoing assembly. Such means is complicated in design and operation since the out-of-tape state mounts 2 have to be individually handled and manipulated by such means prior to application of the OLB process. Thus, production efficiency is not increased with a significant advancement in automation of the overall assembly process by such an approach.

Thus, it is an object of this invention to provide a tape carrier that can be automated with the outer lead bonding (OLB) process performed from the in-tape state wherein the electronic component mounts are separated from the tape carrier and assembled via mounting apparatus into electronic apparatus undergoing assembly.

It is another object of this invention to provide minimal securing means for maintaining electronic component mounts within the confines of the body of a tape carrier but easily separated therefrom by appropriately severing the securing means for immediate mount assembly.

SUMMARY OF THE INVENTION

According to this invention, mounting apparatus is provided for deploying a plurality of a FPC tape carrier electronic component mounting structures comprising a plurality of cut out regions in a FPC tape carrier formed spatially along the length thereof, which regions define electronic component mounts. These cut out regions are contained within the confines of the FPC tape carrier and having a preformed substantially closed loop cut out boundary. Each of these cut out regions may contain at least one electronic component mount comprising a semiconductor integrated circuit chip electronic device electrically connected to at least one lead pattern formed on the carrier within the cut out region boundary. Slits or slit apertures are formed at one or more points along the cut out boundary. In the case of slit apertures, they are provided with a width larger than the cut out boundary per se. Securing means is provided at one or more points along the mount boundary, which are provided at the regions of the slits or slit apertures to secure the electronic component mounts with minimal connection to the body of the tape carrier. Thereafter, the securing means may be easily severed in assembly line fashion with the mounts separated from the tape carrier and transferred via transfer means to a position for their assembly relative to electronic apparatus undergoing assembly. The securing means may be comprised of an adhesive flexible tape (FT) along the length of the tape carrier or may be one or more micro connectors formed from the carrier tape material and extending between the cut out regions forming the mounts and the body of the tape carrier.

Thus, the securing means temporarily secures a plurality of spatially disposed electronic component mounts formed in preformed cut out regions on an tape carrier. As a result, OLB processing can be carried out with the electronic component mounts scarcely attached to the FPC tape carrier. The surface engagement or contact region that secures the component mounts to the FPC tape can thereby be minimized to provide for easy and swift aligned separation of the electronic component mounts directly from the FPC tape carrier for immediate transfer and assembly relative to electronic apparatus. In the first embodiment, the cut out boundaries relative to each electronic component mount can be severed after the adhesive tape has been initially applied traversing a portion of each mount or, preferably across previously formed slits or slit apertures in the cut out boundaries of the tape carrier mounts. Thus, each electronic component mount will be held secured and aligned in its proper position relative to the tape carrier by means of the previously applied adhesive tape. Thereafter, the electronic component mounts may be easily removed by merely severing the adhesive tape at the positions where the tape crosses the previously formed cut out slits.

In another embodiment, the electronic component mounts are secured at one or more positions along the cut out boundary by means of micro connectors formed from the tape carrier material per se. Thereafter, the electronic component mounts may be separated from the tape carrier by merely severing the micro connectors at the positions where they couple the electronic component mounts to the body of the tape carrier.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a plan view of the first embodiment of a carrier tape mounting structure comprising this invention.

FIG. 2 is a plan view of a modified first embodiment of a carrier tape mounting structure comprising this invention.

FIG. 3 is a plan view of the second embodiment of a carrier tape mounting structure comprising this invention.

FIGS. 4A–4H are enlarged views of different securing means applicable to the second embodiment shown in FIG. 3.

FIG. 5 is a perspective view of the carrier tape mounting structure shown in FIG. 1 illustrating a method of removing or otherwise releasing the electronic component mounts from the carrier tape.

FIGS. 6A–6D are schematic diagrams taken along the line 6—6 of FIG. 5 illustrating the procedural steps for carrying out the method of separating the electronic component mounts from the carrier tape.

FIG. 7 is a perspective view of the carrier tape mounting structure shown in FIG. 3 illustrating a method of separating the electronic component mounts from the carrier tape.

FIG. 8A is a schematic front elevation taken along the line 8—8 of FIG. 7 and FIG. 8B is a schematic side elevation of FIG. 8A illustrating the procedural steps for carrying out the method of separating the electronic component mounts from the carrier tape.

FIG. 9 illustrates a side elevation of single pass processing apparatus for mounting, i.e., inner lead bonding (ILB), encapsulating and testing semiconductor chips or electronic devices relative to the lead patterns formed on the tape carrier.

FIG. 10 is a perspective view of a single pass processing apparatus for mounting an adhesive tape relative to the longitudinal extent of the tape carrier and the completion of the external cut out boundary of each electronic component mount.

FIG. 11 is a perspective view of mounting apparatus for separating electronic component mounts from the tape carrier and transporting and mounting respective electronic component mounts relative to an electronic apparatus undergoing assembly, e.g., a LCD panel.

FIG. 12 is a side elevation detailing the apparatus employed in FIG. 11 for severing electronic component mounts from the tape carrier.

FIG. 13 is a plan view of a prior art tape carrier mounting structure.

DESCRIPTION OF THE PREFERRED EMBODIMENTS

Reference is now made to FIG. 1 wherein there is shown a plan view of an example of a mounting structure for a tape carrier comprising this invention. Electronic component mount 2 is prepared on FPC tape carrier 1 by means inner leading bonding (ILB) of semiconductor chip 2' to the inner lead ends of lead patterns 2''. Details relative to this process are explained later in connection with FIG. 9. Also, each electronic component mount 2 has been cut or severed out from the body of tape carrier 1 along cut out boundary 4. In this connection, after encapsulation and testing, FPC tape carrier is presented to apparatus for applying an adhesive flexible tape 3 longitudinally along the length of FPC tape carrier 1 in a manner that the adhesive tape is applied to the tape carrier 1 as well as across a portion of each electronic component mount 2. Details relative to this process are explained later in connection with FIG. 10. Adhesive flexible tape 3 is placed across the outer lead bonding (OLB) terminus of electronic component mounts 2 in the manner shown in FIG. 1. This mount terminus is identified in FIG. 1 as mounting region 2'''. Also, flexible tape 3 is made to cross over a longitudinally aligned series of either slits or slit apertures 5 formed in tape carrier 1 in the regions of cut out boundary 4. Apertures 5 are concurrently formed in tape carrier 1 at the time of formation of sprocket holes 1B and holes (not shown) beneath chips 2'. In the embodiment shown in FIG. 1, there are two apertures 5 formed in boundary 4 of each mount 2 and are aligned in the longitudinal direction of carrier 1 so that the applied flexible tape 3 will cross over each preformed aperture 5.

Although the embodiment in FIG. 1 is shown in connection with slit apertures 5, preformed cut slits in boundary would also suffice. However, the larger width of apertures 5 provides for greater tolerance alignment relative to applying cutting means to sever tape 3 in apertures 5.

Thus, even though electronic component mounts 2 have been severed from FPC tape carrier 1 along closed loop boundary 4, it is held in a secure position relative to the body of tape carrier 1 by means of adhesive flexible tape 3. Adhesive flexible tape 3 is able to maintain electronic component mount 2 in a state of attachment on FPC tape carrier 1 in the manner shown because slit apertures 5 have already been formed when electronic component mount 2 is cut from FPC tape 1 along cut out boundary 4.

FPC tape carrier 1 may be a synthetic resin, such as, polyimide, polyester, glass epoxy and paper phenol. The width of FPC tape carrier 1 may be about 20 mm to 100 mm, and its thickness may be about 10 microns to 150 microns. The length of FPC tape carrier 1 may be from several meters to a hundred and several tens of meters.

Adhesive flexible tape 3 may be comprised of an anisotropic conducting film (ACF) capable of electrically connecting the OLB terminus of electronic component mount 2 with the OLB terminus of an electronic apparatus undergoing assembly. As is known in the art, ACF tapes contain a film of microcapsules having outer electrically insulating coverings with electrically conducting cores so that when pressure is applied to selective regions of the ACF tape, the microcapsules are ruptured in those regions and electrical contact can be achieved, which, in the case here, is between the electrical leads connecting the OLB terminus of a lead pattern mount 2'' with the OLB terminus of an electronic apparatus undergoing assembly. However, it should be noted that any flexible tape material having an adhesive surface may be employed for tape 3, e.g., tapes made of resin, such as, polyimide material and polyester, or of cloth material or glass fiber cloth.

FIG. 2 is a plan view illustrating a modified embodiment of the mounting structure shown in FIG. 1. The structure shown in FIG. 2 is the same as that shown in FIG. 1 except that a second series of slit apertures 5A are aligned along the length of tape carrier 1 parallel to aligned apertures 5 and adhesive flexible tape 3A is applied across apertures 5A as illustrated in FIG. 2. In this embodiment, tapes 3 and 3A must be severed at the four apertures 5 and 5A of each electronic component mount 2 in order to separate them from tape carrier 1. Thus, the modified embodiment of FIG. 2 provides for a higher degree of secureness of mounts 2 to the body of tape carrier 1.

FIG. 3 is a plan view illustrating a second embodiment of a mounting structure for a tape carrier comprising this invention. Electronic component mount 2 in FIG. 3 is the same as that shown in FIGS. 1 and 2 including a cut out boundary 4. However, adhesive flexible tape 3 is not employed as securing means but rather micro connectors 6 are formed within slit apertures 5 from the material of tape carrier 1 in order to maintain electronic component mounts 2 secure to the body of tape carrier 1 after mounts 2 been substantially severed from the confines of the carrier along their cut out boundaries 4. In FIG. 3, four such connectors 6 are shown formed relative to four apertures 5 in connection with each mount 2. However, it should be noted that it is possible to employ only one such micro connector 6 at one location along cut out boundary 4 to hold mount 2 relative to tape carrier 1. In any case, it is preferred to have two such micro connection points for each mount in order to insure maintained planarity of mount 2 relative to the planar surface of tape carrier 1. Thus, for example, a pair of micro connectors 6 may be provided at only diagonally opposite corners or at adjacent corners of each mount 2. In any case, micro connectors 6, whether one, two, three or four, may be deployed at any desired location along cut out boundary 4 of mounts 2.

FIGS. 4A-4H illustrate various different embodiments for micro connectors 6 that may be provided at various locations of apertures 5 along the cut out boundary 4 of each mount 2. It is to be noted that micro connectors 6 of FIGS. 4A-4D differ from micro connectors 6 of FIGS. 4E-4H in that apertures 5 of FIGS. 4A-4D are oval in shape whereas apertures 5 of FIGS. 4E-4H are rectangular in shape. Further, micro connectors 6 of FIGS. 4A and 4E are a single strip comprising material of tape carrier 1; micro connectors 6 of FIGS. 4B and 4F are of pairs of such strips; micro connectors 6 of FIGS. 4C and 4G are a plurality of such strips; and micro connectors 6 of FIGS. 4D and 4H are one or more diagonally disposed strips which extend diagonally across apertures 5.

Relative to the embodiments of FIGS. 1-4, the size of apertures 5 may be about 0.3 mm to 5.0 mm in width and about 2.0 mm to 10 mm long. The widths of micro connectors 6 may be about 0.1 mm to 1.0 mm.

FIG. 5 is a perspective view of the first embodiment shown in FIG. 1 for the purpose of illustrating a method of separating mounts 2 from tape carrier 1. Electronic component mounts 2 remain secured and attached to FPC tape carrier 1 by means of adhesive flexible tape 3 since these mounts 2 have already been previously severed from the body of carrier 1 along cut out boundary 4. Immediately prior to the OLB process being applied to mounts 2 to electrically connect their OLB terminus 2''' to the OLB terminus of an electronic apparatus, mounts 2 are separated from FPC tape carrier 1 by severing adhesive flexible tape 3 in the regions of apertures 5. This mount separating process is illustrated by the sequence of steps of FIGS. 6A-6D as taken along the line 6—6 in FIG. 5.

As shown in FIGS. 5 and FIG. 6A, cutter 7, comprising a heating wire, is positioned directly over apertures 5 of mount 2. Cutter 7 may be comprised of a 1 mm diameter nichrome wire through which an electric current of 0.1 A is passed. In FIG. 6B, cutter 7 is moved downward to the position where it may be in proximity to or in engagement with the surface of adhesive flexible tape 3. At this time, cutter 7 is heated by passing an electric current through the cutter wire. In FIG. 6C, heated cutter 7 is then further dropped downwardly to sever adhesive flexible tape 3 by melting. In FIG. 6D, cutter 7 is further dropped downwardly to completely sever adhesive flexible tapes 3 in apertures 5. In this manner, electronic component mounts 2 are severed from FPC tape carrier 1.

FIG. 7 is a perspective view of the second embodiment shown in FIG. 3 for the purpose of illustrating another method of separating mounts 2 from tape carrier 1. In FIG. 7, electronic component mounts 2 are severed from FPC tape carrier 1 along cut out boundary 4 but remains connected to the body of FPC tape carrier 1 by means of micro connectors 6 formed across slit apertures 5. Immediately prior to the OLB process being applied to mounts 2 to electrically connect their OLB terminus 2‴ to the OLB terminus of an electronic apparatus, mounts 2 are separated from FPC tape carrier 1 by severing micro connectors 6 relative to each mount 2 in the regions of apertures 5. This mount separating process is illustrated by the sequence of FIGS. 8A–8B as taken along the line 8—8 in FIG. 7.

As shown in FIGS. 8A and 8B, cutter 7, comprising a cutting blade made, for example, of stainless steel, is positioned directly over slit aperture 5 along the cut out boundary 4 of mounts 2. In this particular illustration, cutter 7 is then moved downwardly to intersect the cross section of micro connectors 6. With all four connectors 6 relative to each mount severed in this manner, mounts 2 are fully separated from FPC tape carrier 1.

With the practice of either of the foregoing severing methods for separating mounts 2 from the body of tape carrier 1, it is possible to transport electronic component mounts 2 in their in-tape state and in roll form prior to any OLB processing. Thus, mounts 2 remained properly aligned and oriented relative to as well as intact with FPC tape carrier 1 so that subsequent realignment or reorientation of mounts 2 after they have been finally separated from their carrier 1 is not necessary or required.

Reference is now made to FIG. 9 to explain the process of inner lead bonding (ILB), molded and testing relative to the electronic component mounts 2 comprising this invention. Wiring circuit portion or lead patterns 2″ of electronic component mounts 2 are spatially formed along FPC tape carrier 1 after which FPC tape carrier 1 is wound on reel 12A. FPC tape carrier 1 is then drawn from reel 12A and, at station X in FIG. 9, the terminals of integrated circuit chip or electronic device 2′ are attached to the inner lead ends of lead patterns 2″. In this step, inner lead bonding (ILB) is preformed by a gang bonding process as is known in the art via a heated pressure bonding tool 9. Next, carrier 1 is moved and, at station Y, assembled electronic component mount 2 is coated with molding material 11 ejected from supply nozzle 9. Molding material 11 may be a resin material, such as, epoxy resin, and is used for securing and maintaining the electrical connection between chip 2 and lead pattern 2″. Alternatively, molding material 11 may be applied via a printing method. Next, molding material 11 is cured or hardened by passing tape carrier 1 through a heated furnace (not shown). Then, electronic component mount 2 is moved to station Z wherein chip or device 2′ is electrically inspected by probes 10 connected to inspection device 10A. Probes 10 are placed in contact with various terminal leads of chip or device 2′ to test the integrity and operation of chip or device. Then, FPC tape carrier 1 is wound upon reel 12B. In this manner, it is possible to continuously ILB process electronic component mounts 2 on FPC tape carrier 1 in a single pass in their in-tape state.

FIG. 10 is a perspective view illustrating the process of applying adhesive tape 3, e.g., flexible ACF tape, to FPC tape carrier 1. Tape carrier 1 containing electronic component mounts 2, such as wound on reel 12B, may be provided as input to the apparatus of FIG. 10. Tape 3 is initially aligned to cross over longitudinally aligned apertures 5 and is initially applied onto FPC tape carrier 1 via press tool 13. Then, tape 3 is pressed and secured to tape carrier 1 by hot press adhesion device 14. Next, the entire boundary 4 of each electronic component mount 2, except for the regions of apertures 5, is cut by external cutter device 15 so that mounts 2 are retained in a secured position relative to carrier 1 by means of previously applied adhesive tape 3.

Where ACF tape is employed as adhesive flexible tape 3, the operating conditions for hot press adhesion device 14 may be, as an example, a tool temperature of 120° C., an applied pressure of 10 kg/cm$^2$ with an operating time of 3 seconds. The operating pressure of external cut device 15 may be about 4 kg/cm$^2$. After the processing according to FIG. 10, tape carrier 1 may then be wound onto a reel for transport, such as to the apparatus shown in FIGS. 11 and 12.

FIG. 11 illustrates the process of separating electronic component mounts 2 from carrier 1, transport of the severed mounts 2 to positioning means for alignment and connection to an electrical terminal portion of an electronic apparatus comprising, in this case, a liquid crystal display panel. In FIG. 11, electronic component mounts 2 are held by securing means to FPC tape carrier 1 such as in the case of adhesive flexible tape 3. In the view here, tape 3 is actually under carrier tape 1, i.e., carrier tape 1 is inverted as it is fed into the mounting apparatus of FIG. 10. Tape 3 is then severed by cutters 7 in the regions of apertures 5, as shown at the position of mount 2C in FIG. 11. Then, the separated mount, shown at the position of mount 2D, is transported along path 20A via transport means 20 to a predetermined position in the vicinity of the terminal portion of liquid crystal display (LCD) panel 17 for interception by positioning means 30. The apparatus for separation and transport of mounts 20 is shown in FIG. 12. Next, positioning means 30 in conjunction with optical recognition means 19, employing CCD cameras 19A and 19B and LED sources 19C, moves the mount, as indicated at 30A, within proximity of the electrical terminal portion of LCD panel 17 and optically locates the electrical terminal portion 2‴ of electronic component mount 2E. Through servo positioning of means 30, the electrical terminal portion of mount 2E is brought into alignment and engagement with the electrical terminal portion along the edge of LCD panel 17. Next, initial adhesion of the two aligned terminal portions is accomplished at the position shown for adhesion head press 16 so that electronic component mount 2E is initially attached and electrically connected to the electrical terminal portion of LCD panel 17. Temporary or initial pressure adhesion is performed by head press 16, which is operated, for example, at room temperature with a pressure at 3 kg/cm$^2$ for a period of about 1 second. LCD panel 17 is then laterally repositioned by transport means 40, with the previously initially attached mount 2E, now shown at the position of mount 2F, in order to ready panel 17 for receipt of alignment, positioning and pressure bonding of the electrical terminal portion 2‴ of the next mount 2E to the electrical terminal portion of LCD panel 17.

Thus, the OLB process is completed wherein positioning means 30 aligns the outer lead terminus 2‴ of lead patterns 2″ of mounts 2 to permit OLB processing by means of pressure adhesion via thermal/pressure bonding means 16.

FIG. 12 is a frontal view of the separation apparatus employed in FIG. 11 for removing mounts 2 from tape carrier 1. After completion of the processing illustrated in FIG. 10, FPC tape carrier 1 with mounts 2 is wound on a reel 12 in conjunction with a spacer tape 24 and reel 12 is mounted on the separation apparatus as shown in FIG. 12. Spacer tape 24 is wound on reel 12 with tape carrier 1 to protect mounts 2, in particular chips 2', from any damage, particularly during windup of carrier 1 on and transport of reel 12. Carrier tape 1 is then unwound from reel 12 as spacer tape 24 is wound onto reel 23 via tension roller 22A. Carrier 1 is wound around support rollers 21 via tension roller 22B so as to be aligned with severing means 7 and transport means 20. Concurrently with the separation of mounts 2 from tape carrier 1 by severing means 7, mounts 2 are fixed by vacuum on transport means 20 and transported, via path 20A, to positioning means 30 located behind the separation apparatus of FIG. 12, as previously described in connection with FIG. 11. After mounts 2 are removed from tape carrier 1, carrier 1 is discarded at 18.

In the manner explained above, it is possible to transport and continually process electronic component mounts 2 in their in-tape state in a single pass from the ILB process to the OLB process. Furthermore, it is possible to realize a single pass mounting and assembly line from mounting chip or devices 2' relative to lead patterns 2" and performing ILB processing to alignment, positioning and securing mounts 2 relative to electronic apparatus 17 performing OLB processing.

As described above, by employing the mounting structure and mounting method for the tape carrier mount of this invention, it becomes possible to transport electronic component mounts in a simple manner through inner lead bonding and outer lead bonding processes while the mounts remain in an in-tape state. As a result, the automation of tape carrier mounting is greatly advanced so that it becomes possible to offer inexpensive products employing the tape carrier mounts and mounting and separation methods of this invention.

While the invention has been described in conjunction with several specific embodiments, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. A mounting apparatus for deploying a plurality of electronic component mounts spatially formed along a length of a tape carrier for removal therefrom and mounting on an electronic circuit panel apparatus undergoing assembly, comprising
 a plurality of cut out boundary, closed loop slits formed through said tape carrier in a series along the length thereof each forming a cutout tape carrier portion on which each an electronic component mount is secured,
 a plurality of enlarged opening regions formed along a portion of length of each of said cut out boundary slits, said opening regions having a width greater than a width formed by said cut out boundary closed loop slits,
 minimal attachment means extending transversely across said enlarged opening regions for forming a connection between each of said cutout tape carrier portions and a remaining body portion of said tape carrier to minimally hold said each cutout tape carrier portions within the plane of said tape carrier,
 each of said mounts having at least one electrical terminal portion formed along a cutout boundary edge for connection to a corresponding electrical terminal portion formed along an edge of said circuit panel apparatus,
 conveyor means to transport said tape carrier longitudinally along a first path adjacent to and at a different vertical elevation relative to said circuit panel apparatus,
 cutter means positioned over said transported tape carrier in said path ahead of said circuit panel apparatus for consecutively severing said minimal attachment means relative to each of said mounts with severing means extending through the enlarged slit opening regions piercing said minimal attachment means relative to an aligned cutout carrier portion, and
 transport means positioned beneath said transported tape carrier for consecutively transporting said severed mounts from said first path for respectively aligning and securing said mount electrical terminal portion with said corresponding circuit panel apparatus electrical terminal portion.

2. The mounting apparatus of claim 1 wherein said first and second transport means may be a single transport means.

3. The mounting apparatus of claim 1 wherein said securing means operates at a pressure of about 3 kg/cm$^2$ for a period of about one second.

4. The mounting apparatus of claim 1 wherein said minimal attachment means comprises a micro connector formed from an integral portion of material comprising said tape carrier and extending transversely across said enlarged opening regions between each of said cutout tape carrier portions and said tape carrier remaining body portion.

5. The mounting apparatus of claim 1 wherein said minimal attachment means comprises an adhesive tape applied across the surface of said cutout tape carrier portions and aligned transversely across said enlarged opening regions of each of said cutout tape carrier portions and said tape carrier remaining body portion.

6. The mounting apparatus of claim 1 wherein said transport means comprises:
 first transport means positioned beneath said transported tape carrier for consecutively transporting said severed mounts from said first path along a transverse second path to a position approximate with a prescribed alignment axis with an edge of said circuit panel apparatus along a third path,
 alignment means located in said third path to align said mount electrical terminal portion with said apparatus electrical terminal portion along a prescribed alignment axis,
 second transport means elevating said mount along a third path while maintaining alignment of said mounts along said prescribed vertical axis until said mount and apparatus electrical terminal portions are substantially in engagement with one another,
 securing means located along said third path to engage and press against said engaged terminal portions to bond together said mount and apparatus terminal electrical terminal portions, and
 third transport means to index said electronic circuit panel apparatus along a fourth path parallel to said first path to align a new apparatus electrical terminal portion along said edge in alignment with said third path to receive the next mount electrical terminal portion.

* * * * *